(12) United States Patent
Kim

(10) Patent No.: US 7,393,778 B2
(45) Date of Patent: Jul. 1, 2008

(54) SEMICONDUCTOR DEVICE AND METHOD FOR FABRICATING THE SAME

(75) Inventor: Jea Hee Kim, Yeoju (KR)

(73) Assignee: Dongbu Electronics Co., Ltd., Seoul (KR)

( * ) Notice: Subject to any disclaimer, the term of this patent is extended or adjusted under 35 U.S.C. 154(b) by 155 days.

(21) Appl. No.: 11/024,594

(22) Filed: Dec. 28, 2004

(65) Prior Publication Data
US 2005/0140011 A1 Jun. 30, 2005

(30) Foreign Application Priority Data
Dec. 30, 2003 (KR) .................. 10-2003-0100711

(51) Int. Cl.
*H01L 21/4763* (2006.01)
(52) U.S. Cl. ............. 438/637; 438/675; 438/680; 438/723
(58) Field of Classification Search ............... 438/637, 438/675, 680, 723; 257/750, 774, 775
See application file for complete search history.

(56) References Cited
U.S. PATENT DOCUMENTS

| | | | |
|---|---|---|---|
| 6,194,304 B1 * | 2/2001 | Morozumi et al. | 438/618 |
| 6,245,659 B1 * | 6/2001 | Ushiyama | 438/620 |
| 6,326,287 B1 * | 12/2001 | Asahina et al. | 438/584 |
| 6,331,494 B1 * | 12/2001 | Olson et al. | 438/770 |
| 2004/0266106 A1 * | 12/2004 | Lee | 438/257 |

* cited by examiner

*Primary Examiner*—Hsien-ming Lee
(74) *Attorney, Agent, or Firm*—Andrew D. Fortney

(57) ABSTRACT

A semiconductor device and a method for fabricating the same in which a protective oxide layer is formed on an insulating interlayer gap are disclosed. An example semiconductor device includes a semiconductor substrate having lower structures, an insulating interlayer on the semiconductor substrate to cover the lower structures, and an $SiH_4$-oxide layer on the insulating interlayer. The $SiH_4$-oxide has hydrogen constituents removed by displacement to prevent an amorphous material layer from being formed on the insulating interlayer. The example semiconductor device includes a contact hole in the insulating interlayer and the $SiH_4$-oxide layer for exposing predetermined portions of the lower structures. Additionally, the example semiconductor device includes a contact plug formed inside the contact hole to electrically connect the lower structures with a metal line.

15 Claims, 8 Drawing Sheets

SEMICONDUCTOR DEVICE AND METHOD FOR FABRICATING THE SAME

RELATED APPLICATION

This application claims the benefit of the Korean Application No. P2003-100711 filed on Dec. 30, 2003, which is hereby incorporated herein by reference in its entirety.

TECHNICAL FIELD

The present disclosure relates to a semiconductor device, and more particularly, to a semiconductor device and a method for fabricating the same, in which a protective oxide layer is formed on an insulating interlayer.

BACKGROUND

As a semiconductor device is more highly integrated, the number of metal lines increases. Meanwhile, a pitch of the metal line decreases gradually. As the pitch of the metal line decreases, a resistance of the metal line increases. Also, a parasitic capacitance between an insulating interlayer for the metal line and the corresponding metal line is generated, thereby deteriorating the characteristics of the semiconductor device. As a result, it is necessary to provide a low dielectric insulating interlayer suitable for the high-integration semiconductor device. Recently, a Boron-Phosphorus Silicate Glass (hereinafter, referred to as "BPSG") layer and a Fluorine Silicate Glass (hereinafter, referred to as "FSG") layer have been developed for use a low dielectric insulating interlayer. Both of these recently developed layer are applied in a wide range of applications.

As shown in FIG. 1, a known semiconductor device includes a semiconductor substrate 1 having lower components. In this state, an insulating interlayer 2 of a BPSG layer or an FSG layer is deposited on the semiconductor substrate 1. Then, a contact hole H is formed in the insulating interlayer 2, and a contact plug 6 is formed therein for an electric contact between the lower components and a metal line 5. Also, a barrier metal layer 7 is additionally formed inside the contact hole H to improve the electric contact of the contact plug 6 and a reflection prevention layer 4 is formed on the insulating interlayer 2 for formation of the contact hole H.

In the drawings, for convenience, the reflection prevention layer 4 is depicted in the completed semiconductor device. However, in fact, after the reflection prevention layer 4 is used to prevent the diffused reflection of pattern light (for example, UV rays) when forming the contact hole H by patterning a photoresist pattern, the reflection prevention layer 4 is completely removed in the semiconductor device by the following polishing process.

In the known semiconductor device, if the insulating interlayer 2 of the BPSG layer or the FSG layer is exposed to the atmosphere without the additional process, an amorphous material layer is unnecessarily formed in the surface of the insulating interlayer 2. To prevent this problem, as shown in the drawings, a protective oxide layer, for example, a $SiH_4$-oxide layer 3 is additionally formed on the insulating interlayer 2. By forming the $SiH_4$-oxide layer 3, it is possible to prevent the amorphous material layer from generating in the surface of the insulating interlayer 2.

The $SiH_4$-oxide layer has the most stable chemical structure among oxide layers formed by plasma, whereby it is possible to effectively prevent the formation of the amorphous material layer. However, because the $SiH_4$-oxide layer contains hydrogen, the hydrogen goes out of an interface during the fabrication process.

In this state, as shown in the drawings, if the reflection prevention layer 4 for forming the contact hole is formed on the corresponding $SiH_4$-oxide layer at an acidity between (ph)3- and (ph)4, as shown in FIG. 2, the hydrogen 3a is rapidly transferred to the reflection prevention layer 4 and is combined with the oxygen 4b of the reflection prevention layer 4, thereby generating the hydroxide group (4a:OH—). As a result, the acidity (ph) of the reflection prevention layer 4 is lowered so that the reflection function of the reflection prevention layer 4 deteriorates.

Under the deterioration in the function of the reflection prevention layer, in case of performing the photoresist pattern process by using the corresponding reflection prevention layer and the process of forming the contact hole by using the photoresist pattern, the completed contact hole H is formed in a barrel type or shape due to a bowing phenomenon generated by the diffused reflection of the reflection prevention layer 4. In this state, if the barrier metal layer 7 and the contact plug 6 are formed without the additional process, it is impossible to stably fill the inside of the contact hole with the barrier metal layer 7 and the contact plug 6. As a result, the metal line 5 may not be stably and electrically connected with the semiconductor substrate 1, thereby deteriorating the quality of the completed semiconductor device.

DETAILED DESCRIPTION

Figure 1:
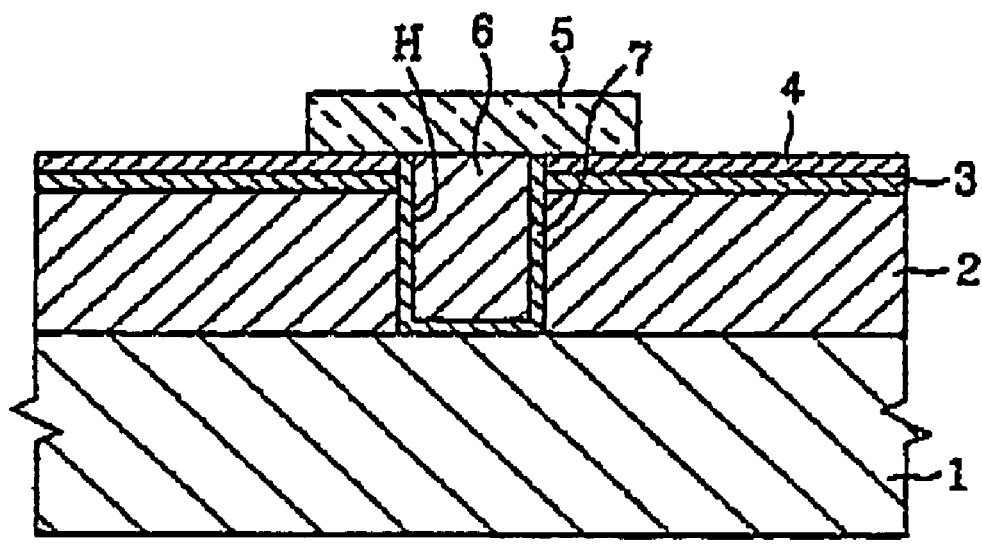
FIG. 1 depicts a known semiconductor device.
Figure 2:
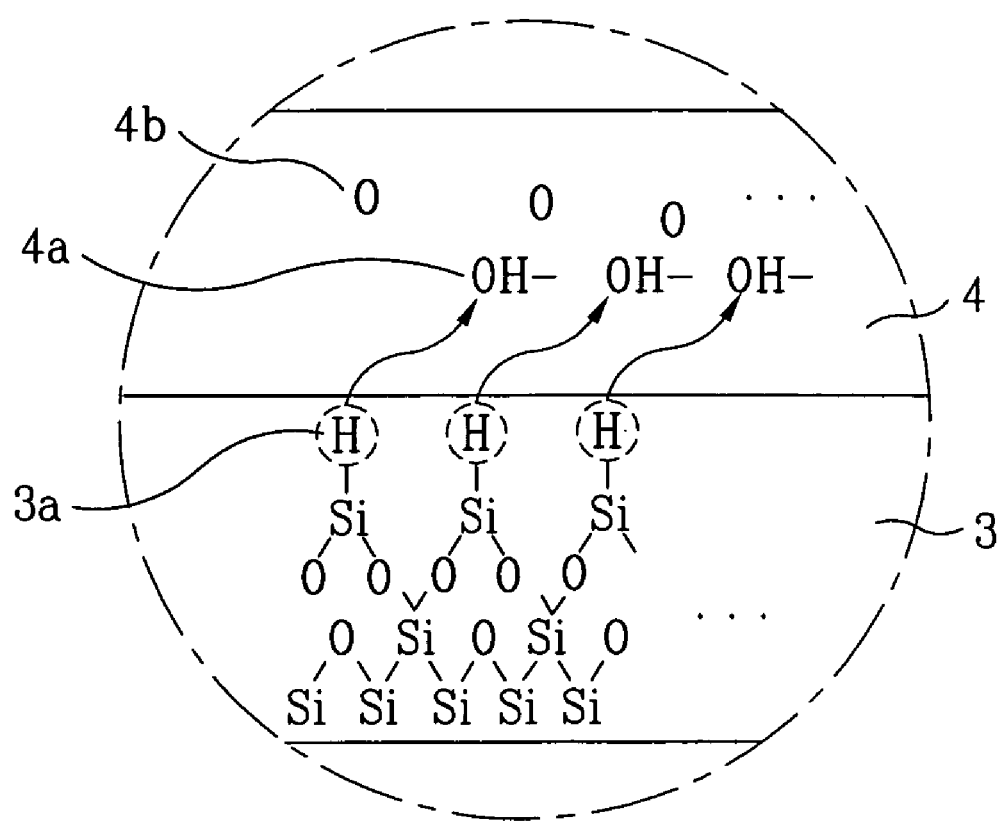
FIG. 2 depicts a contact state of a $SiH_4$-oxide layer and a reflection prevention layer in a known semiconductor device.

In general, the example methods and apparatus described herein provide a semiconductor device and a method for fabricating the same in which a protective oxide layer, for example, a $SiH_4$-oxide layer is formed on an insulating interlayer. Additionally, an additional process may be performed to remove hydrogen H from the corresponding $SiH_4$-oxide layer to improve the quality of the $SiH_4$-oxide layer so that it is possible to prevent the hydrogen H from being transferred to a reflection prevention layer provided above the $SiH_4$-oxide layer. As a result, the hydrogen H of the $SiH_4$-oxide layer is not transferred to the reflection prevention layer, whereby the reflection prevention layer has no decrease in acidity, thereby maintaining the constant acidity.

The example methods and apparatus described herein may also provide a semiconductor device and a method for fabricating the same in which a reflection prevention layer performs a normal reflection function by preventing the decrease of acidity in the reflection prevention layer in a method of preventing hydrogen of the $SiH_4$-oxide layer from being transferred from the reflection prevention layer, and a photoresist pattern and a contact hole are normally formed in predetermined shapes without any deformation, thereby preventing a gap filling trouble in a barrier metal layer and a contact plug formed in the contact hole.

Further, the example methods and apparatus described herein may be used to prevent deformation in a contact hole by realizing a reflection function of a reflection prevention layer, and to prevent a gap filling trouble in a barrier metal layer and a contact plug, thereby improving the quality of the semiconductor device.

In one example, a semiconductor device includes a semiconductor substrate having lower structures; an insulating interlayer on the semiconductor substrate to cover the lower structures; an $SiH_4$-oxide layer on the insulating interlayer, the $SiH_4$-oxide layer of which hydrogen constituents are removed by displacement to prevent an amorphous material layer from being formed on the insulating interlayer; a contact hole in the insulating interlayer and the $SiH_4$-oxide layer for exposing predetermined portions of the lower structures; and a contact plug formed inside the contact hole to electrically connect the lower structures with a metal line.

In another example, a method for fabricating a semiconductor device includes forming an insulating interlayer on a semiconductor substrate having lower structures; forming a $SiH_4$-oxide layer on the insulating interlayer; removing hydrogen constituents from the $SiH_4$-oxide layer by an additional process; forming a reflection prevention layer on the $SiH_4$-oxide layer; forming a contact hole by selectively removing the insulating interlayer, the $SiH_4$-oxide layer and the reflection prevention layer, for exposing predetermined portions of the lower structures; and forming a contact plug inside the contact hole.

Figure 3:
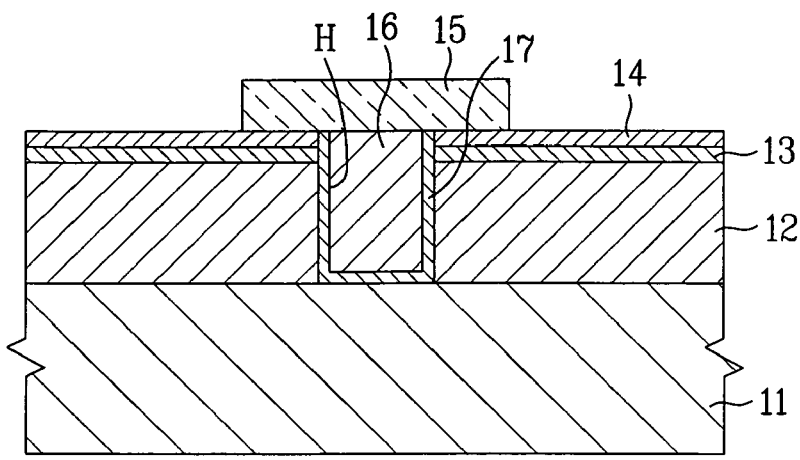
FIG. 3 depicts an example semiconductor device.

FIG. 3 depicts an example semiconductor device. As shown in FIG. 3, an insulating interlayer 12 of a BPSG layer or an FSG layer is deposited on a semiconductor substrate 11 of selectively including lower structures (not shown) such as a gate electrode, source/drain diffusion layers, and a lower metal line. Then, a contact hole 'H' is formed in the insulating interlayer 12 so that it is possible to obtain a structure of a contact plug 16 for electrically connecting the lower structures with a metal line 15 by the contact hole 'H'.

In this case, a barrier metal layer 17 is additionally formed on inner surfaces of the contact hole 'H', thereby improving the contact quality of the contact plug 16. Also, a reflection prevention layer 14 for forming the contact hole 'H' is formed on the insulating interlayer 12. In FIG. 3, for convenience, it is shown as the reflection prevention layer 14 remains in a completed semiconductor device. However, in fact, after using the reflection prevention layer 14 to prevent diffused reflection of pattern light (for example, UV rays), the reflection prevention layer 14 is completely removed by polishing. At this time, a protective layer, for example, a $SiH_4$-oxide layer 13 is formed on the insulating interlayer. That is, the surface of the insulating interlayer 12 is covered with the $SiH_4$-oxide layer 13 so that it is possible to prevent an amorphous material layer from being formed on the surface of the insulating interlayer 12.

Figure 4:
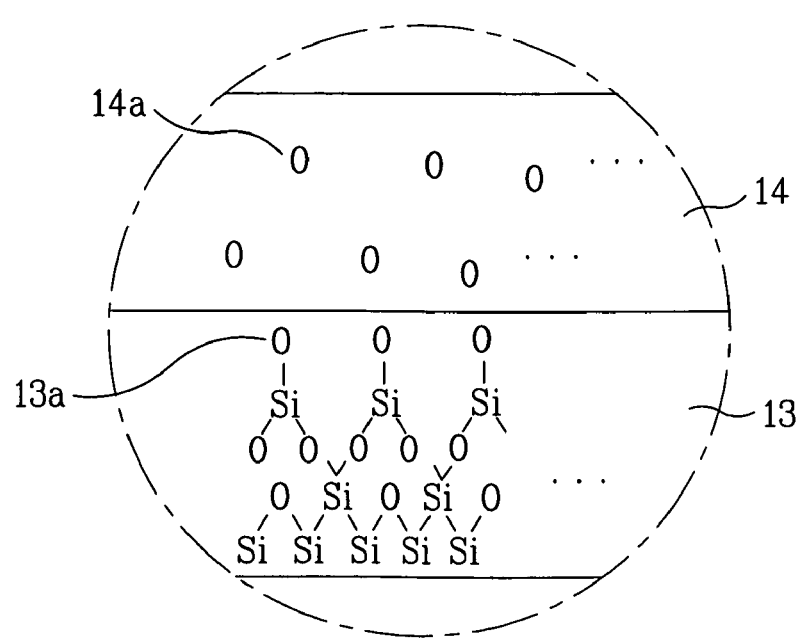
FIG. 4 depicts a contact state of a $SiH_4$-oxide layer and a reflection prevention layer in an example semiconductor device.

As described above, the $SiH_4$-oxide layer 13 basically contains hydrogen H. In this respect, if the reflection prevention layer 14 for forming the contact hole 'H' is formed on the $SiH_4$-oxide layer 13 without the additional process, the hydrogen H remaining in the $SiH_4$-oxide layer 13 is transferred to the reflection prevention layer 14. Then, the transferred hydrogen H is combined with oxygen O of the reflection prevention layer 14, thereby unnecessarily generating hydration group (OH—). As a result, acidity (pH) of the reflection prevention layer 14 is rapidly lowered. Under the bad conditions, as shown in FIG. 4, the hydrogen H is removed from the $SiH_4$-oxide layer 13 and the oxygen 13a displaces the hydrogen H.

Accordingly, in the $SiH_4$-oxide layer 13, the amount of hydrogen H is remarkably decreased, and the amount of oxygen 13a is remarkably increased. In this state, if the reflection prevention layer 14 for forming the contact hole 'H' is formed on the $SiH_4$-oxide layer 13, it is possible to prevent the hydrogen H of the $SiH_4$-oxide layer 13 from being unnecessarily transferred to the reflection prevention layer 14.

Because the hydrogen H is not transferred from the $SiH_4$-oxide layer 13 to the reflection prevention layer 14, the reflection prevention layer 14 maintains the sufficient amount of oxygen 14a without the unnecessary hydrogen group (OH—) so that the reflection prevention layer 14 maintains the normal acidity (pH). Accordingly, even though the reflection prevention layer 14 is in direct contact with the $SiH_4$-oxide layer 13, the reflection prevention layer 14 can obtain a reflection function.

Under circumstances that the reflection prevention layer 14 normally performs the reflection function by maintaining the normal acidity (pH), in case of performing a photoresist pattern process by using the reflection prevention layer 14 and a process of forming the contact hole 'H' by using a photoresist pattern, the contact hole 'H' is normally formed in a predetermined shape without bowing. If the contact hole 'H' has any deformation in shape by bowing, the barrier metal layer 17 and the contact plug 16 may have a gap filling trouble. Accordingly, since the contact hole 'H' is normally formed in the predetermined shape without bowing, it is possible to prevent the gap filling trouble in the barrier metal layer 17 and the contact plug 16.

As the reflection prevention layer 14 normally performs the reflection function, the contact hole 'H' has no deformation in shape. Accordingly, the inside of the contact hole 'H' is normally filled with the barrier metal layer 17 and the contact plug 16, whereby the metal line 15 formed on the insulating interlayer 12 is electrically and stably connected with the lower structures, thereby realizing the high-quality semiconductor device.

Figure 5A:
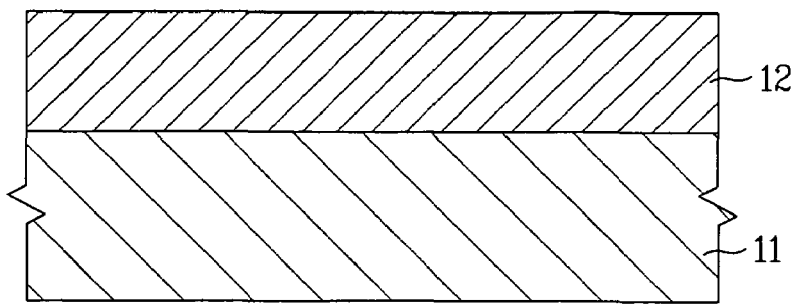
FIG. 5A to FIG. 5K are cross-sectional views of an example fabrication process for the example semiconductor devices described herein.

First, as shown in FIG. 5A, the lower structures such as the gate electrode, the source/drain diffusion layers, and the lower metal line are selectively formed in the semiconductor substrate 11 by performing the sequential process of deposition, photolithography, ion implantation and planarization. At this time, the lower structures may be varied in kind and shape. After that, the insulating interlayer 12 of the BPSG layer or the FSG layer is deposited on the semiconductor substrate 11 by the deposition process, for example, high-pressure CVD (chemical vapor deposition). Then, the insulating interlayer 12 is planarized by polishing chemically and mechanically.

Figure 5B:
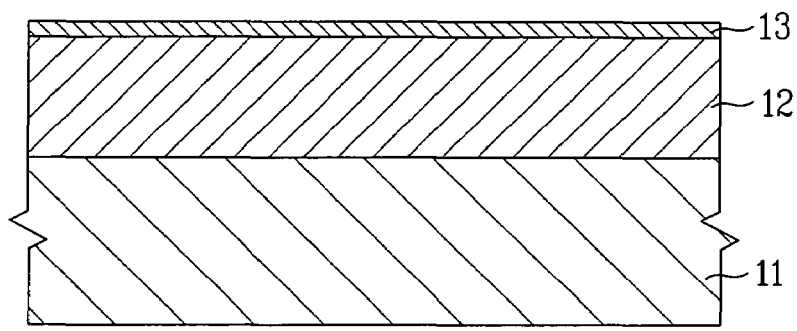
Figure 5C:
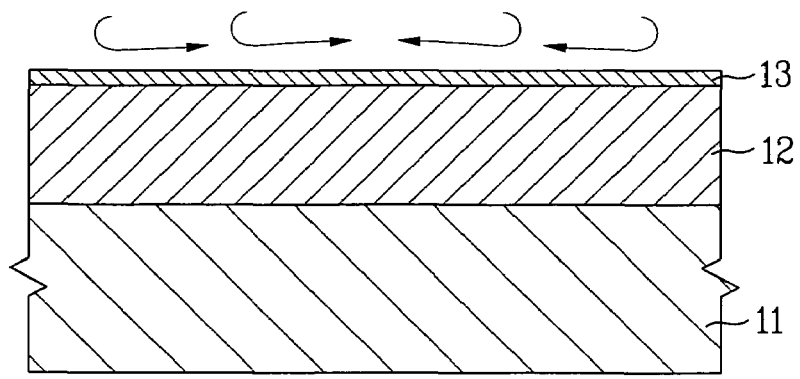
Figure 5D:
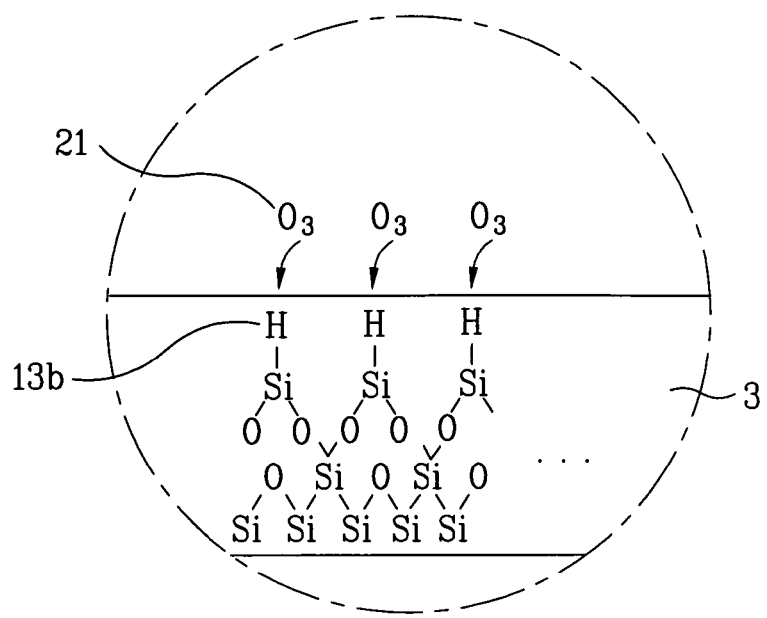
Figure 5E:
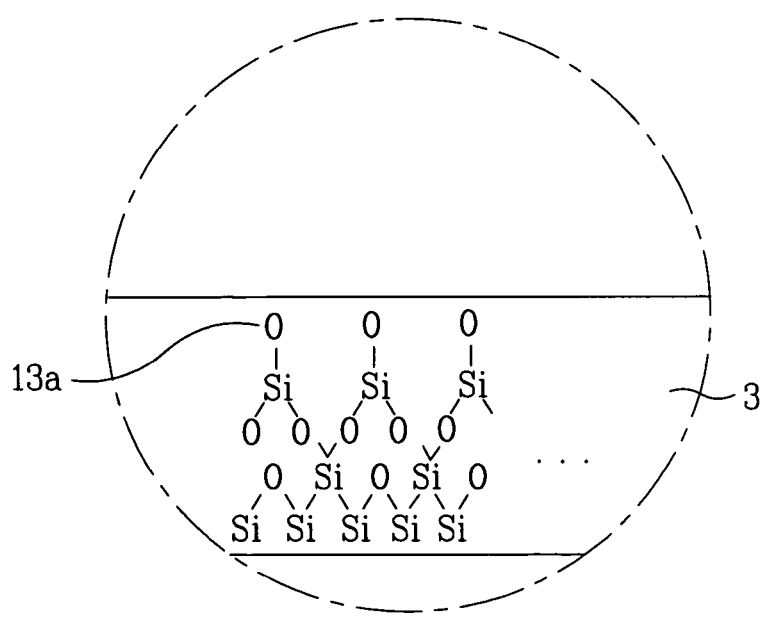

Subsequently, as shown in FIG. 5B, the $SiH_4$-oxide layer 13 is formed on the insulating interlayer 12 by performing the $SiH_4$-CVD process. In this case, the $SiH_4$-oxide layer 13 covers the surface of the insulating interlayer 12 so that it is possible to prevent the amorphous material layer from being formed on the surface of the $SiH_4$-oxide layer 13. According to the aforementioned process, after forming the $SiH_4$-oxide layer 13 on the insulating interlayer 12 as shown in FIG. 5C, a wet process is performed by flowing a specific solution containing $O_3$ at a percentage between 3% and 10%, for example, pure DI (deionized) water. In this case, as shown in FIG. 5D, $O_3$ 21 of the specific solution reacts with the hydrogen constituent 13b of the $SiH_4$-oxide layer 13, whereby the oxygen constituent of the specific solution displaces the hydrogen constituent 13b. By performing the displacement process, as shown in FIG. 5E, the $SiH_4$-oxide layer 13 has the amount of hydrogen H remarkably decreased and the amount of oxygen 13a remarkably increased, wherein the increased amount of oxygen is in proportion to the decreased amount of hydrogen.

The process of reacting $O_3$ 21 of the specific solution with the $SiH_4$-oxide layer 13 is performed at room temperature for 8 to 12 minutes. Accordingly, it is possible to prevent the problem of causing the less amount of oxygen 13a in the $SiH_4$-oxide layer 13, which is generated by a short time period of the displacement process, or to prevent the problem of causing the excessive amount of oxygen 13a in the $SiH_4$-oxide layer 13, which is generated by a long time period of the displacement process.

The aforementioned fabrication process operations may be varied as needed to suit a particular application. For example, when removing the hydrogen constituent 13b from the $SiH_4$-oxide layer 13, a dry-etch process may be performed with a specific gas instead of the specific solution. On completing the formation process of the $SiH_4$-oxide layer 13 on the insulating interlayer 12, preferably, the specific gas containing $O_3$, for example, oxygen constituent is flowed on the $SiH_4$-oxide layer, in a chamber, by an in-situ process. In this case, as shown in FIG. 5D, $O_3$ of the specific gas reacts with the oxygen constituent 13b of the $SiH_4$-oxide layer 13, whereby the oxygen constituent 13a of the specific gas displaces the hydrogen constituent 13b. As a result, on completing the displacement process, as shown in FIG. 5E, the $SiH_4$-oxide layer 13 has the amount of hydrogen constituent 13b remarkably decreased, and the amount of oxygen constituent 13a remarkably increased, wherein the increased amount of oxygen constituent 13a is in proportion to the decreased amount of hydrogen constituent 13b.

The process of reacting the specific gas containing $O_3$ at 3% to 10% with the $SiH_4$-oxide layer 13 is performed for 20 to 30 seconds. Accordingly, it is possible to prevent the problem of causing the less amount of oxygen constituent 13a in the $SiH_4$-oxide layer 13, which is generated by a short time period of the displacement process or to prevent the problem of causing the excessive amount of oxygen constituent 13a in the $SiH_4$-oxide layer 13, which is generated by a long time period of the displacement process.

Figure 5F:
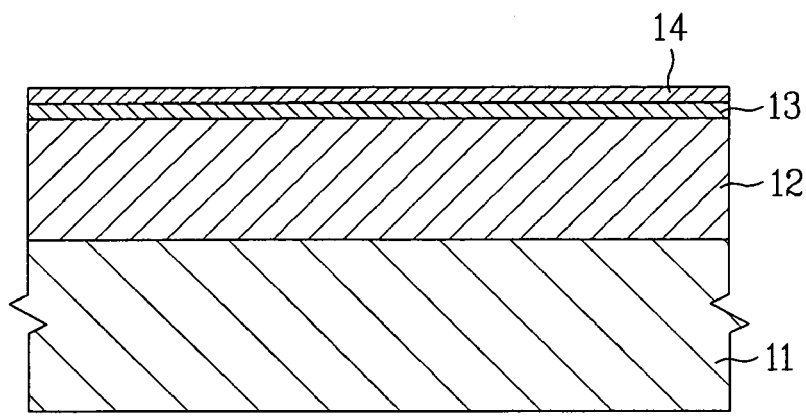

According to the aforementioned process, the hydrogen constituent 13b is removed from the $SiH_4$-oxide layer 13. Then, as shown in FIG. 5F, the reflection prevention layer 14 is deposited on the $SiH_4$-oxide layer 13.

Figure 5G:
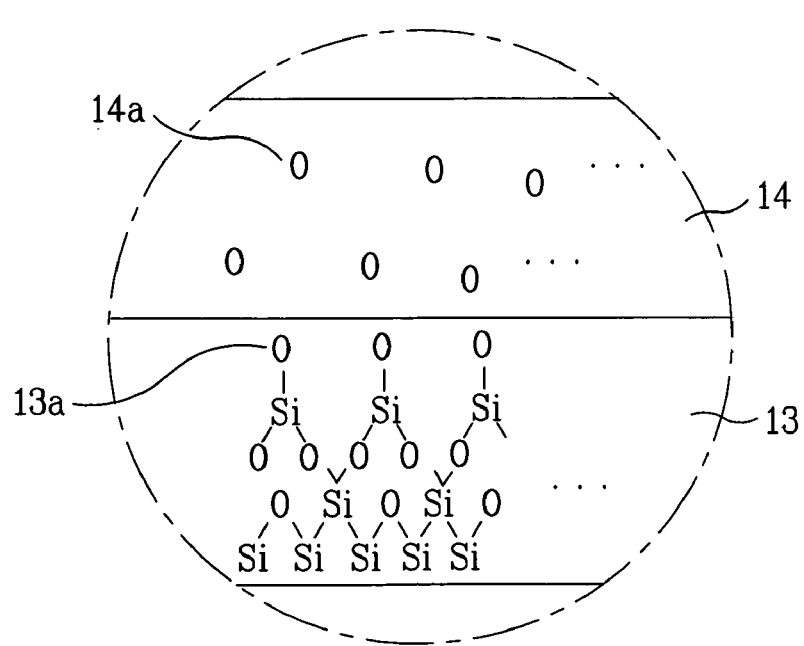

As described above, by performing the sequential process to the $SiH_4$-oxide layer 13 below the reflection prevention layer 14, the $SiH_4$-oxide layer 13 has the amount of hydrogen constituent remarkably decreased, and the amount of oxygen constituent remarkably increased, wherein the increased amount of oxygen constituent is in proportion to the decreased amount of hydrogen constituent. Accordingly, it is possible to prevent the hydrogen constituent of the $SiH_4$-oxide layer 13 from being transferred to the reflection prevention layer 14. As a result, as shown in FIG. 5G, the reflection prevention layer 14 stably maintains the sufficient amount of oxygen 14a without the undesirable hydration group (OH—), thereby maintaining the normal acidity (pH). That is, even though the reflection prevention layer 14 is in direct contact with the $SiH_4$-oxide layer 13, the reflection prevention layer 14 stably and normally maintains the reflection function.

Figure 5H:
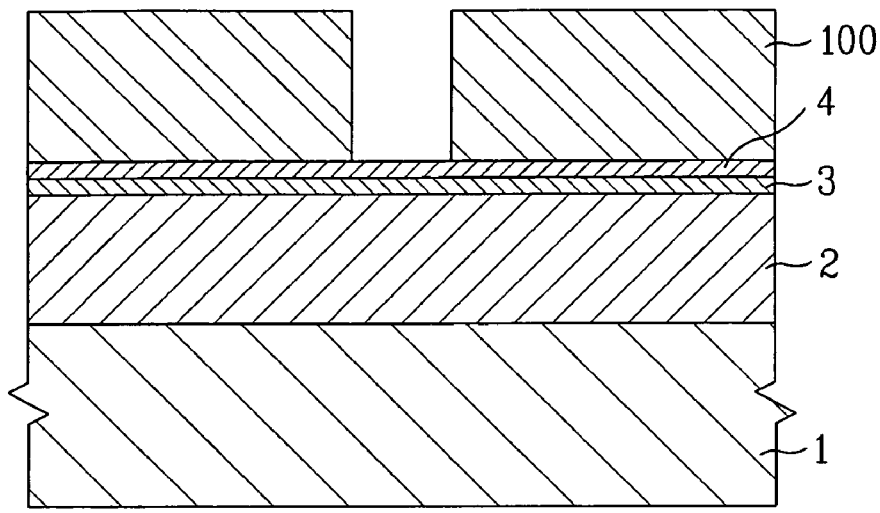
Figure 5I:
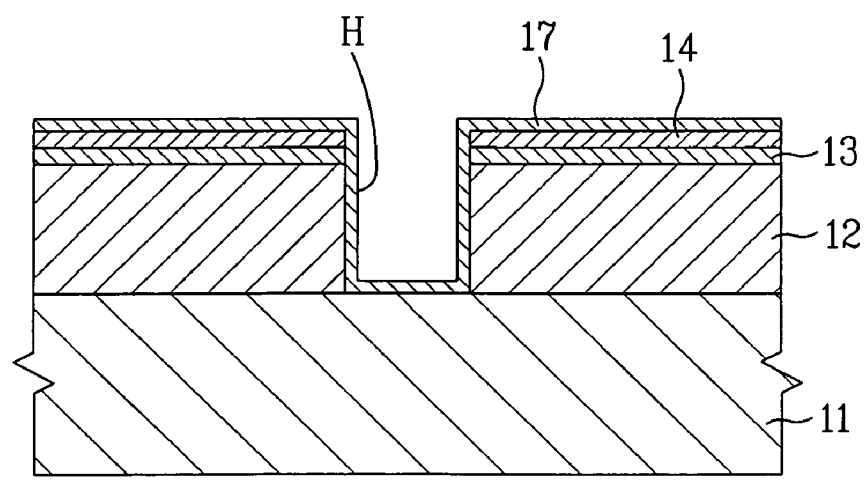

Subsequently, a photoresist layer is deposited on the reflection prevention layer 14 and then an exposure and development process is performed thereto, thereby forming the photoresist pattern 100 to define an area for the contact hole, as shown in FIG. 5H. After that, as shown in FIG. 5I, the reflection prevention layer 14, the $SiH_4$-oxide layer 13 and the insulating interlayer 12 are selectively removed by using the photoresist pattern 100 as a mask, thereby forming the contact hole 'H' for electrically connecting the metal line with the corresponding portion of the lower structures of the semiconductor substrate 11. Then, after forming the contact hole 'H', the photoresist pattern 100 is removed.

As described above, the reflection prevention layer 14 for the contact hole 'H' stably maintains the normal acidity (pH), thereby performing the reflection function normally. That is, the contact hole 'H' is formed in the predetermined shape without the deformation of bowing. After completing the formation of the contact hole 'H', the barrier metal layer 17, for example, Ti/TiN layer is formed at a constant thickness on the insulating interlayer 12 and on inner surfaces of the contact hole 'H' by sputtering.

Figure 5J:
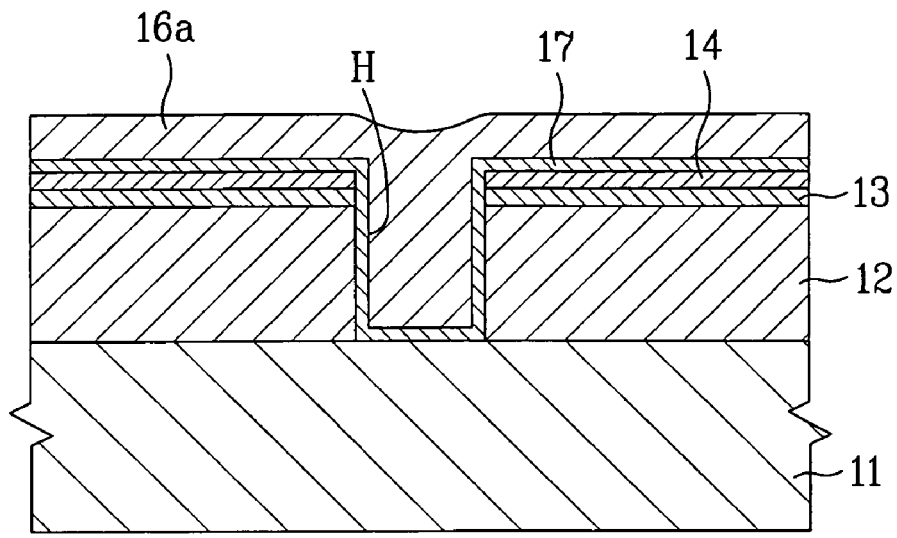

Subsequently, as shown in FIG. 5J, a thick tungsten layer 16a is formed on the insulating interlayer 12 including the contact hole 'H' having the barrier metal layer 16 on the inner surfaces thereof. Then, the tungsten layer 16a is partially removed with the barrier metal layer 17 and the reflection prevention layer 14, thereby forming the contact plug 16 for filling the inside of the contact hole 'H' and for electrically connecting the lower structures with the metal line.

Figure 5K:
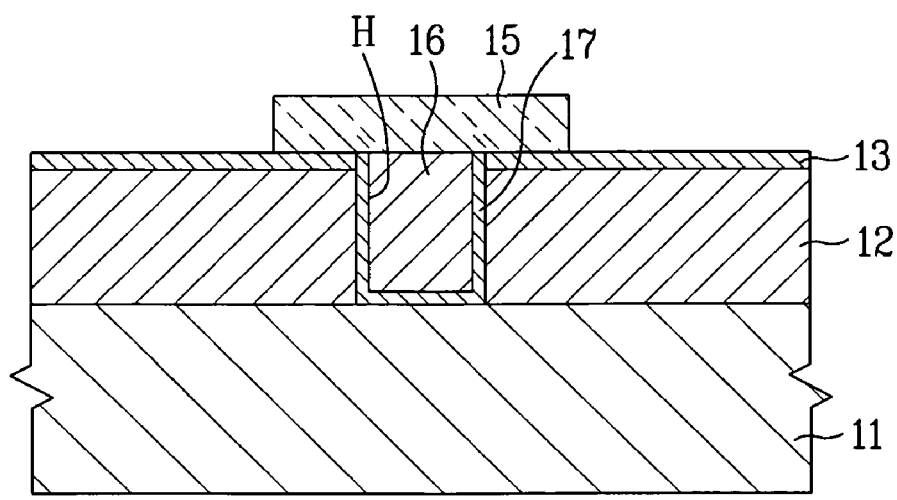

As described above, the reflection prevention layer 14 normally performs the reflection function, and the contact hole 'H' is formed in the predetermined shape without bowing. As a result, it is possible to prevent the gap filling trouble of the barrier metal layer 17 and the contact plug 16, the gap filling trouble generated by the deformation of the contact hole 'H'. That is, the inside of the contact hole 'H' is stably filled with the tungsten layer. After that, as shown in FIG. 5K, the metal line 15 is formed above the contact hole 'H' by the sequential process of deposition and patterning. At this time, the metal line 15 is electrically connected with the lower structures by means of the contact plug 16.

In the example semiconductor device and fabrication method thereof described herein, the protective oxide layer, for example, the $SiH_4$-oxide layer is formed on the insulating interlayer and then additional process for removing the hydrogen from the $SiH_4$-oxide layer is performed, thereby improving the quality of the $SiH_4$-oxide layer. Accordingly, the reflection prevention layer has no hydrogen constituent transferred from the $SiH_4$-oxide layer, so that the reflection prevention layer stably maintains the normal acidity (pH).

Like that, by removing the hydrogen constituents from the $SiH_4$-oxide layer, it is possible to prevent the acidity (pH) of the reflection prevention layer from being lowered, whereby the reflection prevention layer normally performs the reflection function. As a result, the photoresist pattern and the contact hole are stably formed in the predetermined shapes without bowing so that the barrier metal layer and the contact plug have no gap filling trouble, thereby realizing the high-quality semiconductor device.

While the examples herein have been described in detail with reference to example embodiments, it is to be understood that the coverage of this patent is not limited to the disclosed embodiments, but, on the contrary, is intended to cover various modifications and equivalent arrangements included within the sprit and scope of the appended claims.

What is claimed is:

1. A method for fabricating a semiconductor device comprising:

forming an insulating interlayer on a semiconductor substrate having lower structures;

forming an $SiH_4$-oxide layer containing hydrogen therein on the insulating interlayer;

removing hydrogen constituents from a surface layer of the hydrogen-containing SiH$_4$-oxide layer;

forming a reflection prevention layer on the SiH$_4$-oxide surface layer having hydrogen constituents removed therefrom;

forming a contact hole by selectively removing the insulating interlayer, the SiH$_4$-oxide layer containing hydrogen, the SiH$_4$-oxide surface layer having hydrogen constituents removed, and the reflection prevention layer, for exposing predetermined portions of the lower structures; and forming a contact plug inside the contact hole.

2. The method of claim 1, wherein removing the hydrogen constituents from the SiH$_4$-oxide layer comprises reacting an O$_3$-containing solution with the SiH$_4$-oxide layer.

3. The method of claim 2, wherein reacting the O$_3$-containing-solution with the SiH$_4$-oxide layer is performed for 8 to 12 minutes.

4. The method of claim 2, wherein the O$_3$-containing solution contains O$_3$ at a percentage between 3% and 10%.

5. The method of claim 1, wherein removing the hydrogen constituents from the SiH$_4$-oxide layer comprises reacting an O$_3$-containing gas with the SiH$_4$-oxide layer.

6. The method of claim 5, wherein the O$_3$-containing gas is provided in an in-situ process of targeting the SiH$_4$-oxide layer.

7. The method of claim 5, wherein reacting the O$_3$-containing gas with the SiH$_4$-oxide layer is performed for 20 to 30 seconds.

8. The method of claim 5, wherein the O$_3$-containing gas comprises O$_3$ at a percentage between 3% and 10%.

9. The method of claim 1, wherein forming the insulating interlayer comprises depositing BPSG.

10. The method of claim 1, wherein forming the insulating interlayer comprises depositing FSG.

11. The method of claim 1, wherein forming the insulating interlayer comprises a high-pressure CVD process.

12. The method of claim 1, further comprising planarizing the insulating interlayer.

13. The method of claim 1, further comprising polishing the insulating interlayer.

14. The method of claim 1, wherein forming the SiH$_4$-oxide layer comprises an SiH$_4$-CVD process.

15. The method of claim 1, wherein forming the contact plug comprises depositing tungsten in the contact hole.

* * * * *